United States Patent
Yeh et al.

[11] Patent Number: 6,046,601
[45] Date of Patent: Apr. 4, 2000

[54] METHOD FOR MEASURING THE KINK EFFECT OF A SEMICONDUCTOR DEVICE

[75] Inventors: Meng-Lin Yeh, Taipei; Yang-Hui Fang, Tainan, both of Taiwan

[73] Assignee: United Semiconductor Circuit Corp., Hsinchu, Taiwan

[21] Appl. No.: 09/106,745

[22] Filed: Jun. 30, 1998

[51] Int. Cl.[7] .................................................... G01R 31/26
[52] U.S. Cl. ............................................................ 324/769
[58] Field of Search ................................. 324/765, 158.1, 324/769, 768, 716, 719; 438/427, 431, 14, 17, 347; 257/40, 48

[56] References Cited

U.S. PATENT DOCUMENTS

| | | | |
|---|---|---|---|
| 5,185,280 | 2/1993 | Houston et al. | 257/347 |
| 5,767,549 | 6/1998 | Chen et al. | 257/351 |
| 5,904,540 | 5/1999 | Sheng et al. | 438/427 |

*Primary Examiner*—Vinh P. Nguyen

[57] ABSTRACT

A method for measuring the extent of the kink effect of a transistor is disclosed herein. The aforementioned method includes the following steps. The first, generate a simulated drain current versus a gate voltage according to the transistor. Secondary, generate a drain current versus the gate voltage. Finally, integrate a difference between the simulated drain current and the drain current by the gate voltage.

1 Claim, 5 Drawing Sheets

METHOD FOR MEASURING THE KINK EFFECT OF A SEMICONDUCTOR DEVICE

BACKGROUND OF THE INVENTION

1. Field of the Invention

This invention relates to a method for measuring the kink effect of a transistor, particularly relates to a method for measuring the kink effect with an index representing to what extent the kink effect influence the transistor.

2. Description of the Prior Art

As the dimension of the semiconductor device is shrunk, the shallow trench isolation (STI) is usually used in isolation structure. As shown in FIG. 1, if there is an electrical field 10 crowding at the channel near the STI-active edge, and a voltage is applied to the channel by the gate poly 11. The corner electrical field 10a is larger than the channel center electrical field 10b. So the channel at the corner is formed before the whole channel enter the strong inversion state. In other words, a parasitic device is formed before the gate voltage reaches the threshold voltage. Thus even the transistor is at the off state, the channel is still formed by the parasitic device, and the off current (standby current: $I_{off}$) is thus increased.

The profile of STI has a strong relationship with the kink effect of the transistor. The condition that increasing the kink effect is described as the following: the decrease of the radius r of birds beak, the decrease of the side wall angle $\Theta$, and the decrease of the terren height h. The change of the aforementioned factor result in the semiconductor device enter a weak inversion state. Especially, the increase of the standby current has a serious influence in the power assumption of the semiconductor device.

As usually used, the change of the logarithm of drain current versus gate voltage ($\log(I_{ds})$ versus $V_g$) is a traditional method to observe how the semiconductor device is influenced by the kink effect. As shown in FIG. 2A, the drain current versus gate voltage curve (Ids-Vg curve) of a kink effect free device with various substrate bias is smooth. When the substrate bias is 0 volt, the Ids-Vg curve is curve 200, whereas, when the substrate bias is 1 volt, the $I_{ds}$-$V_g$ curve is curve 201. The x-axis represents the gate voltage ($V_g$) of the semiconductor device, and the y-axis represents the logarithm of the drain current (log(Ids)). When the $I_{ds}$-$V_g$ curve of a device with kink effect is plotted, the result is shown in FIG. 2B. When the substrate bias is 0 volt, the $I_{ds}$-$V_g$ curve is curve 210, whereas, when the substrate bias is 1 volt, the Ids-Vg curve is curve 211. It is obvious that when the semiconductor device with kink effect is utilized, there is some torsion in the Ids-Vg curves.

When the first order partial derivative of the Ids-Vg curve to gate voltage ($V_g$) is taken, the drawing is shown in FIG. 3A. At this occurrence, the semiconductor device is kink effect free and the substrate bias is 2 volt. The curve 230 represents the logarithm value of the drain current (log(Ids)) and the curve 231 represents the transconductance (gm) of the semiconductor device when the substrate bias is 2 volt. As shown in FIG. 3B, the curve 240 represents the logarithm value of the drain current (log(Ids)) when the semiconductor device has the kink effect and the substrate bias is 2 volt. The curve 241 represents the transconductance (gm) of the semiconductor device when the substrate bias is 2 volt. It is obvious that, at some gate voltages, the transconductance has local maximum and local minimum.

When the second order partial derivative of the Ids-Vg curve to gate voltage (Vg) is taken; the plot is shown in FIG. 4A. At this occurrence, the semiconductor device is kink effect free and the substrate bias is 2 volt. The curve 250 represents the logarithm value of the drain current (log(Ids)) and the curve 251 represents the transconductance (gm) of the semiconductor device when the substrate bias is 2 volt. As shown in FIG. 4B, the curve 260 represents the logarithm value of the drain current (log(Ids)) when the semiconductor device has the kink effect and the substrate bias is 2 volt. The curve 261 represents the transconductance (gm) of the semiconductor device when the substrate bias is 2 volt. It is obvious that, at point A and point B, the transconductance has local minimum. At point C and point D, the transconductance has local maximum.

When the parasitic device enter the threshold state, the second order partial derivative of the Ids-Vg curve has the local minimum at the point A. When the channel of the semiconductor device enter threshold state, the second order partial derivative of the Ids-Vg curve has the local minimum at the point B. The point D stands for the occurrence that the channel of the semiconductor device enter the weak inversion. The point C represents the occurrence that the kink effect has the most serious influence. The point C and the point D both represent the start point of the change of increment of the channel current or the transconductance. So the point A and the point B represent the beginning and the end of the operation of the parasitic device respectively.

Observing the difference of gate voltage between the point A and point B, if the kink effect exists, then the difference of gate voltage between the point A and point B exists. Thus the traditional technology uses the difference of gate voltage between the point A and point B as an index. When the difference of gate voltage between the point A and point B exist, the kink effect exists in the semiconductor device. So the traditional technology use the maximum value of the second order partial derivative of the Ids-$V_g$ curve to represent the influence of the kink effect.

Because the unit of the expression of the foregoing representation is $(\log(A)V^2)$, the increment of standby current resulted from kink effect and the static power assumption can not be described in the traditional technology. In addition, in the laboratory, the kink effect is measured by comparing the $\log(Id)$-$V_g$ curve of a semiconductor device with kink effect and without kink effect. Whereas the aforementioned method can not be used in the wafer assurance testing (WAT) in mass production. Though a prior art ("ANALYSIS OF WIDTH EDGE EFFECT IN ADVANCED ISOLATION SCHEMES FOR DEEP SUB-MICRON CMOS TECHNOLOGY" BY Psallagolity, M. Ada-HANIFI, M. Paoli, and Haond, IEEE Transactions on electron devices vol. 43, November 1996) indicates that the difference of the gate voltage when the parasitic channel enters the threshold and when the channel of the semiconductor device enter the strong inversion can be used as an index for the kink effect. Yet the method mentioned above can not describe the influence of the kink effect when the semiconductor device is at off mode.

SUMMARY OF THE INVENTION

A method for measuring the extent of the kink effect of a transistor is disclosed herein. The aforementioned method includes the following steps. The first, generate a simulated drain current versus a gate voltage according to the transistor. Secondary, generate a drain current versus the gate voltage. Finally, integrate a difference between the simulated drain current and the drain current by the gate voltage.

BRIEF DESCRIPTION OF THE DRAWINGS

The above features of the present invention will be more clearly understood from consideration of the following descriptions in connection with accompanying drawings in which.

DESCRIPTION OF THE PREFERRED EMBODIMENT

Figure 1:
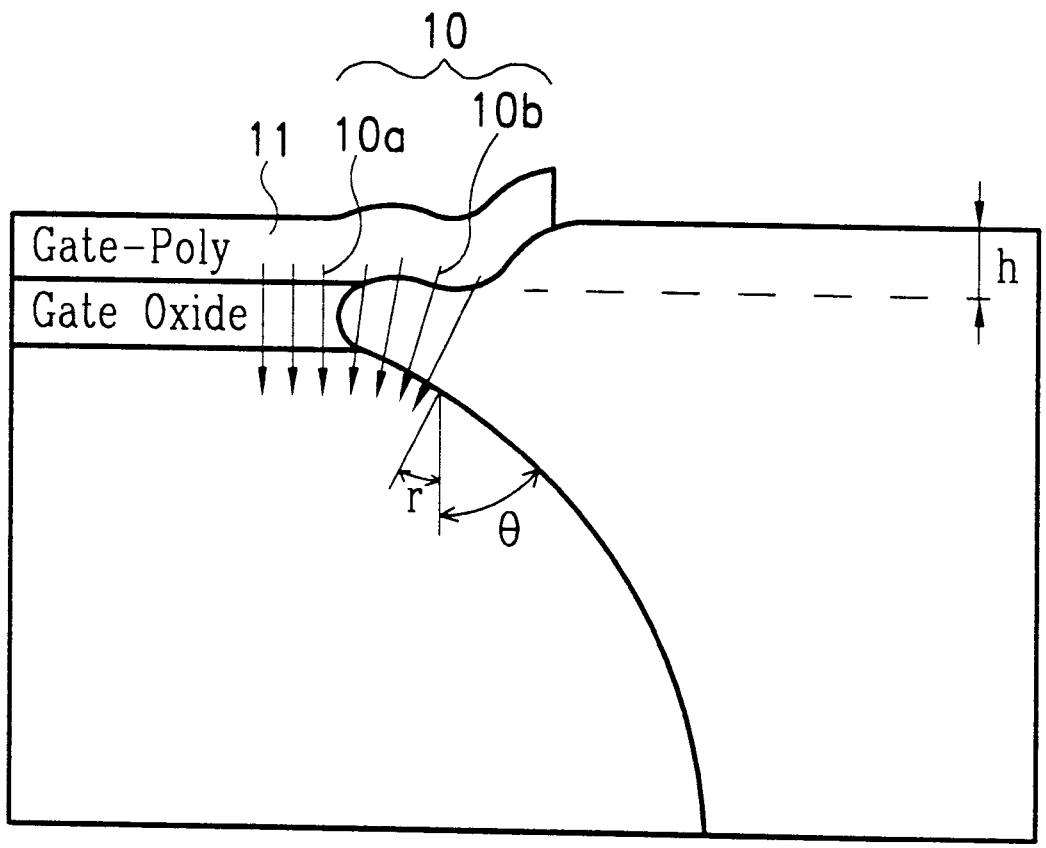
FIG. 1 is a cross sectional view of a wafer illustrating the factors affecting the kink effect of the semiconductor device.
Figure 2A:
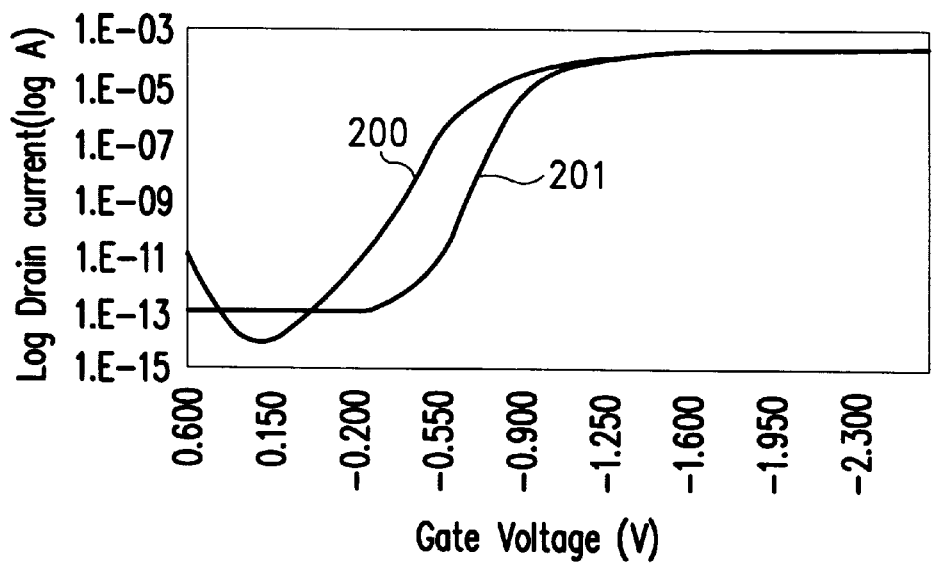
FIG. 2A illustrates the log(Ids)–Vg curve of the kink effect free semiconductor device, wherein various substrate voltages are applied to the semiconductor device.
Figure 2B:
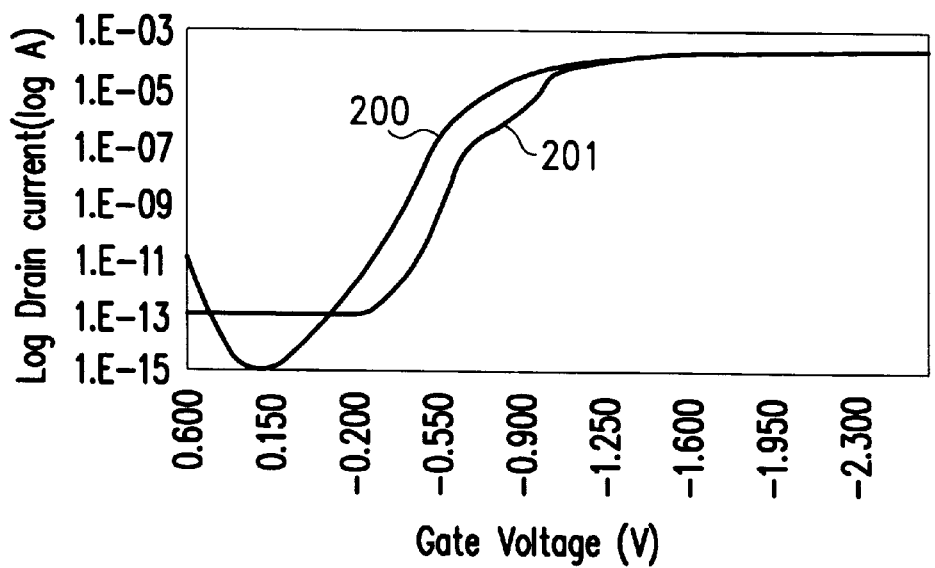
FIG. 2B illustrates the log(Ids)–Vg curve of a semiconductor device with kink effect, wherein various substrate voltages are applied to the semiconductor device.
Figure 3A:
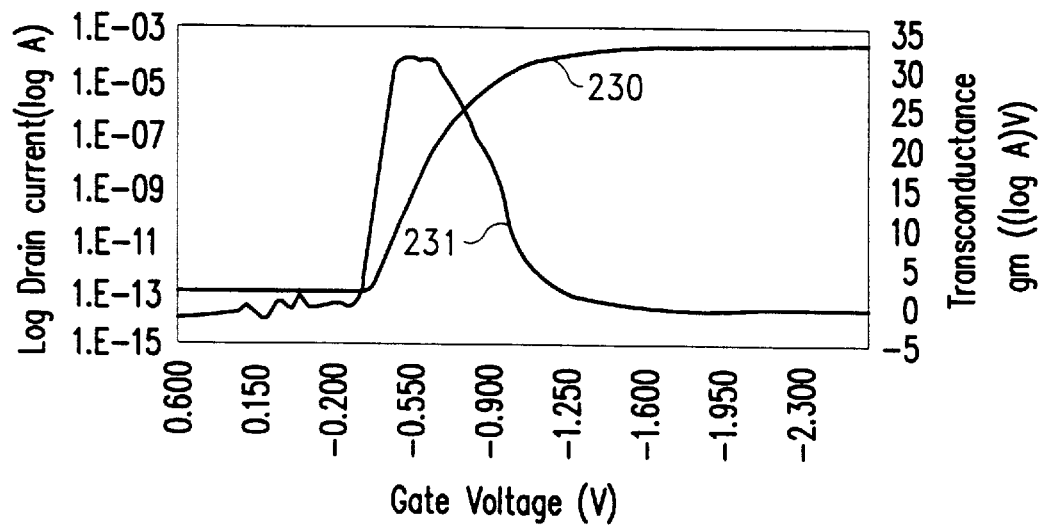
FIG. 3A illustrates the first order of log(Ids)–Vg curve of the kink effect free semiconductor device, wherein the transconductance is also shown in FIG. 3A.
Figure 3B:
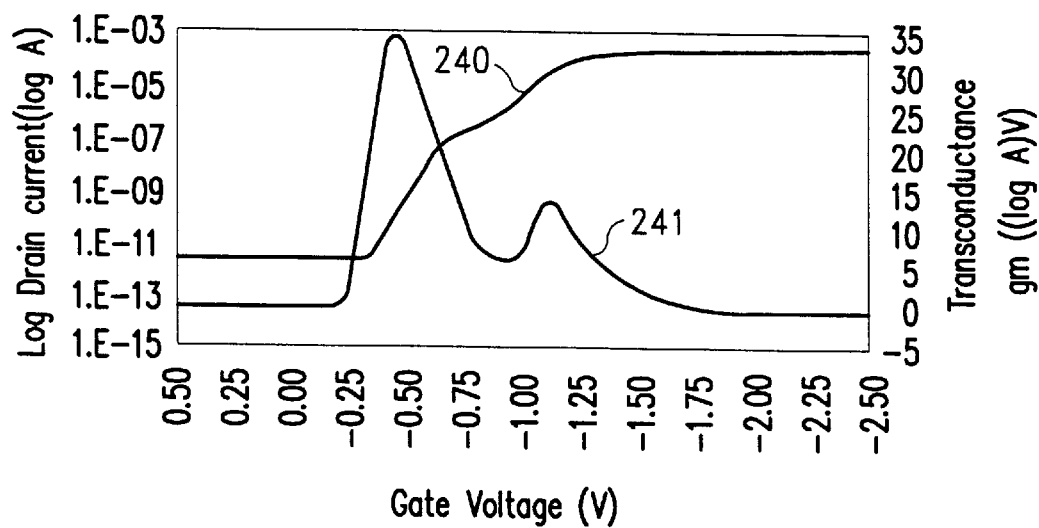
FIG. 3B illustrates the first order of log(Ids)–Vg curve of the semiconductor device with the kink effect, wherein the transconductance is also shown in FIG. 3B.
Figure 4A:
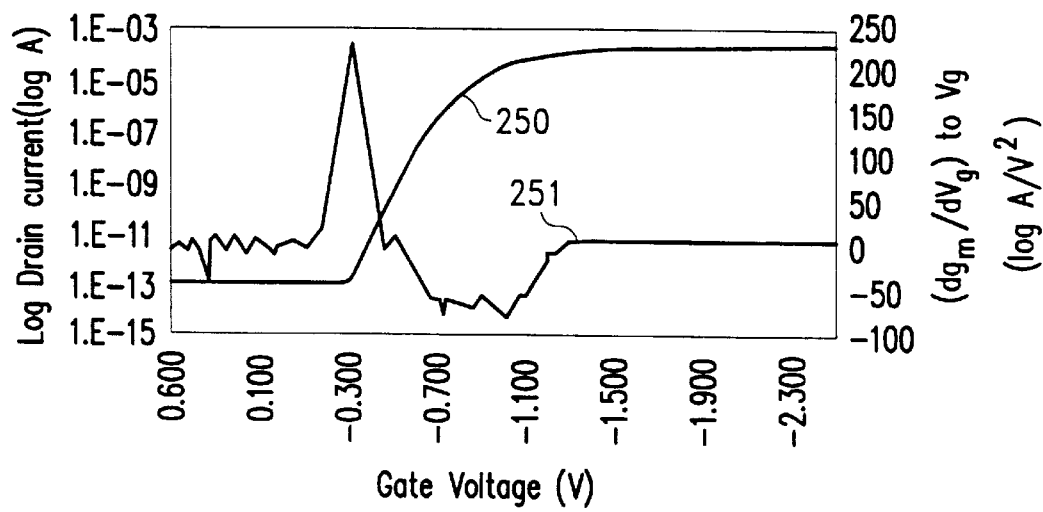
FIG. 4A illustrates the second order of log(Ids)–Vg curve of the kink effect free semiconductor device, wherein the derivative of the transconductance to the gate voltage is also shown in FIG. 4A.
Figure 4B:
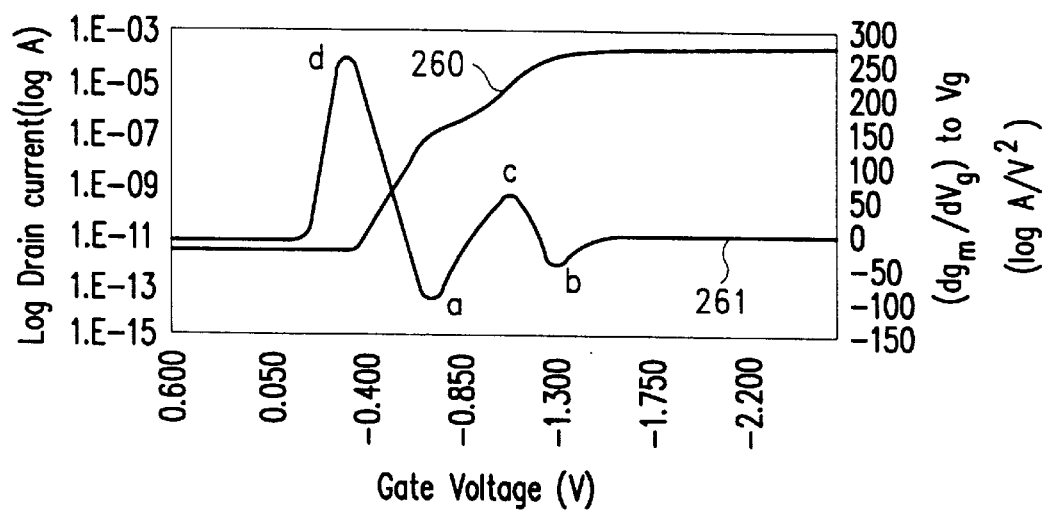
FIG. 4B illustrates the second order of log(Ids)–Vg curve of the semiconductor device with the kink effect, wherein the derivative of the transconductance to the gate voltage is also shown in FIG. 4B.

The definition of the kink effect in the STI technology is identical with the hump effect, the corner effect, the edge effect, and the corner parasitic effect. To describe the increment of standby current of a semiconductor device resulted from the kink effect and the static power assumption of the semiconductor device, the present invention provides a method to measure the aforementioned issues. At first, measure the change of the drain current versus gate voltage (Ids–Vg), and calculate the log(Ids)–Vg curve (as shown in FIG. 2B). Secondary, calculate the first order partial derivative of the Ids–Vg curve to gate voltage (Vg) (as shown in FIG. 3B), and calculate the second order partial derivative of the Ids–Vg curve to gate voltage (Vg) (as shown in FIG. 4B).

The first order partial derivative of the Ids–Vg curve to gate voltage (Vg) can be expressed as the following equation:

$$gm = d(Ids)/d(Vg) = [(Ids_n - Ids_{n-1})/\Delta Vg] \quad (1)$$

Vg is an optional value.

The second order partial derivative of the Ids–Vg curve to gate voltage (Vg) can be expressed as the following equation:

$$d(gm)/d(Vg) = [(gm_n - gm_{n-1})/\Delta Vg] \quad (2)$$

Vg is an optional value.

Next, determine the gate voltages at which the second order partial derivative of the Ids–Vg curve has a first local maximum value and a second local maximum value. Assume the gate voltages mentioned above are Vc and Vd respectively. Similarly, determine the gate voltages at which the second order partial derivative of the Ids–Vg curve have a first local minimum value and a second local minimum value. Assume the gate voltages mentioned above are $V_a$ and $V_b$ respectively. Record the transconductance $gm_a$ and $gm_b$ when the gate voltage equals to Va and Vb respectively using the first order partial derivative of the Ids–Vg curve to gate voltage (Vg). Record the logarithm of the drain current at the Va, i. e., log(Ids(Va)).

Next, calculate the slope m, the slope can be expressed by the following equation:

$$m = (gm_b - gm_a)/(Vb - Va) \quad (3)$$

Express a line by an equation using the aforementioned slope m as follows:

$$gm(Vg) = m \cdot (\Delta Vg \cdot \text{index}) + gm_a \quad (4)$$

Vg is from Va to Vb, $\Delta Vg = (Vb - Va)/n$, and index is an integer from 1 to n.

Integrating equation (3) to obtain the following equation:

$$\log(Ids(Vg)) = (m/2)\Delta Vg^2 + gm_a \cdot \Delta Vg + \log(Ids(Va)) \quad (5)$$

Figure 5:
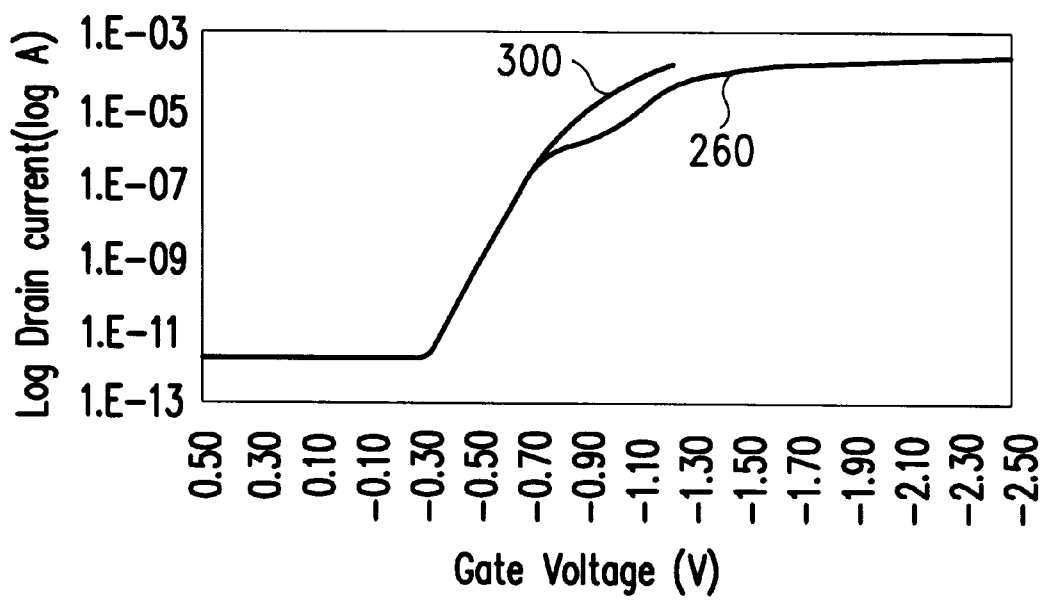
FIG. 5 uses the area between the drain current and the simulated drain current to represent the static power assumption of the semiconductor device.

The drawing of equation (5) is shown in FIG. 5.

The simulated drain current can be derived from equation (5) to obtain the following equation:

$$Ids\_simu(Vg) = 10^{\log(Ids(Vg))} \quad (6)$$

From the equation (5) and (6), because every term on the right side of the equation (5) is known, the simulated drain current Ids_simu(Vg) can be obtained.

Finally, calculate the static power assumption by integrating the difference between the simulated drain current (Ids_simu(Vg)) and drain current (Ids(Vg)) by the $\Delta Vg$. To implement the aforementioned integration, a mathematical approach method is utilized. The mathematical approach can be expressed as the following equation:

$$\{[Ids\_simu(Vg_n) - Ids(Vg_n)] + [Ids\_simu(Vg_{(n-1)}) - Ids(Vg_{(n-1)})]\} \cdot \Delta Vg/2 \quad (7)$$

$Vg_n$ is from Va to Vb.

The mathematical approach method mentioned above is a preferred embodiment, whereas, any modification of the mathematical approach is appreciated. According to the equation (5), the simulated log(Ids)–Vg curve is shown as curve 300 in FIG. 5. In addition, the curve 260 representing a semiconductor with kink effect is compared to the simulated drain current curve 300 in FIG. 5. Furthermore, the area between the curve 300 and the curve 260 is the static power assumption of the semiconductor device with the kink effect.

As will be understood by persons skilled in the art, the foregoing preferred embodiment of the present invention is illustrative of the present invention rather than limiting the present invention. Having described the invention in connection with a preferred embodiment, for example, if the various mathematical approach is used in the preferred embodiment. As long as the static power assumption is used to measure the extent of kink effect, the modification will now suggest itself to those skilled in the art. While the preferred embodiment of the invention has been illustrated and described, it will be appreciated that various changes can be made therein without departing from the spirit and scope of the invention.

What is claimed is:

1. A method for measuring kink effect of a transistor, said method comprising:

generating an Ids–Vg curve by measuring a drain current versus a gate voltage, said drain current being a current of a drain electrode of said transistor, said gate voltage being a voltage across a gate electrode of said transistor;

generating a log(Ids)–Vg curve by taking a logarithm of said drain current versus said gate voltage;

taking a first order partial derivative of said log(Ids)–Vg curve by said gate voltage;

taking a second order partial derivative of said log(Ids)–Vg curve by said gate voltage;

determining a first maximum gate voltage, a second maximum gate voltage, a first minimum gate voltage and a second minimum gate voltage, when said gate voltage being at said first maximum gate voltage and said second maximum gate voltage, said drain current has a local maximum value, when said gate voltage being at said first minimum gate voltage and said second minimum gate voltage, said drain current has a local minimum value;

determining a first transconductance by substituting said first minimum gate voltage into said first order partial derivative of said log(Ids)–Vg curve;

determining a second transconductance by substituting said second minimum gate voltage into said first order partial derivative of said log(Ids)–Vg curve;

generating a first log drain current by taking a logarithm of said drain current at said gate voltage being equal to said first minimum gate voltage;

generating a slope using a ratio of a first difference to a second difference, said first difference being a subtract of said second transconductance and said first transconductance, said second difference being said substrate of said second minimum gate voltage and said first minimum gate voltage;

generating a first equation representing a transconductance curve of said transistor from said first minimum gate voltage to said second minimum gate voltage, said transconductance curve being formed of adding said first transconductance to a product of said slope, an index, and said second difference divided by a specified number, said index being an integer from one to said specified number;

integrating said first equation to obtain a second equation, said second equation being said logarithm of said drain current;

generating a simulated drain current from said first minimum gate voltage to said second minimum gate voltage; and generating a power assumption value of said transistor using an integration of said second difference by said subtract of said drain current and said simulated drain current.

* * * * *